(12) United States Patent
Mizuno et al.

(10) Patent No.: US 8,617,363 B2
(45) Date of Patent: Dec. 31, 2013

(54) MAGNETRON SPUTTERING APPARATUS

(71) Applicant: Tokyo Electron Limited, Tokyo (JP)

(72) Inventors: Shigeru Mizuno, Yamanashi (JP); Hiroyuki Toshima, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/661,462

(22) Filed: Oct. 26, 2012

(65) Prior Publication Data
US 2013/0105309 A1 May 2, 2013

(30) Foreign Application Priority Data

Oct. 27, 2011 (JP) .................................. 2011-236220
Nov. 2, 2011 (JP) .................................. 2011-241673

(51) Int. Cl.
*C23C 14/35* (2006.01)

(52) U.S. Cl.
USPC ............... 204/298.16; 204/298.17; 204/298.2

(58) Field of Classification Search
USPC ............................. 204/298.16, 298.17, 298.2
See application file for complete search history.

(56) References Cited

U.S. PATENT DOCUMENTS

| 5,082,542 A | * | 1/1992 | Moslehi et al. | 204/192.32 |
| 5,770,025 A | * | 6/1998 | Kiyota | 204/298.2 |
| 6,440,282 B1 | * | 8/2002 | Wada et al. | 204/298.2 |

FOREIGN PATENT DOCUMENTS

| JP | 2000-309867 | 11/2000 |
| JP | 2004-162138 | 6/2004 |

* cited by examiner

*Primary Examiner* — Keith Hendricks
*Assistant Examiner* — Jason M Berman
(74) *Attorney, Agent, or Firm* — Oblon, Spivak, McClelland, Maier & Neustadt, L.L.P.

(57) ABSTRACT

A magnetron sputtering apparatus where a target is disposed to face a substrate installed in a vacuum chamber and magnets are disposed on a rear surface of the target, including a power supply unit configured to apply a voltage to the target; and a magnet array body including a magnet group arranged on a base body provided at the rear surface of the target. In the magnet array body, rod-shaped magnets each having different polarities at opposite ends thereof are disposed in a mesh shape on a surface of the base body facing the target; the mesh has a 2n polygonal shape (n being an integer greater than or equal to 2); permeable core members are disposed at intersection points of the mesh surrounded by the ends of the rod-shaped magnets; and end portions of the rod-shaped magnets which surround each of the core members have a same polarity.

17 Claims, 14 Drawing Sheets

US 8,617,363 B2

MAGNETRON SPUTTERING APPARATUS

CROSS-REFERENCE TO RELATED APPLICATIONS

This application claims priority to Japanese Patent Application Nos. 2011-241673 and 2011-236220 filed on Nov. 2 and Oct. 27, 2011, respectively, the entire contents of which are incorporated herein by reference.

FIELD OF THE INVENTION

The present invention relates to a magnetron sputtering apparatus.

BACKGROUND OF THE INVENTION

A magnetron sputtering apparatus used in a manufacturing process of semiconductor devices, for example, as shown in FIG. 13, is configured such that a target 13 made of a film forming material is disposed to face a substrate 12 in a vacuum chamber 11 set to a low pressure atmosphere, a magnet body 14 is provided at the top side of the target 13, and, if the target 13 is a conductor such as a metal, a magnetic field is generated in the vicinity of a bottom surface of the target 13 in a state where a negative DC voltage is applied thereto. Further, there is provided an anti-adhesion shield (not shown) to prevent the adhesion of particles to an inner wall of the vacuum chamber 11.

The magnet body 14, as shown in FIG. 14, generally configured such that, for example, a circular magnet 16 having a polarity different from that of an annular magnet 15 is disposed on the inside of the magnet 15. FIG. 14 is a plan view of the magnet body 14 seen from the target 13. In this example, the polarity of the outer magnet 15 facing the target 13 is set to an S pole and the polarity of the inner magnet 16 facing the target 13 is set to an N pole. Accordingly, in the vicinity of the bottom surface of the target 13, a horizontal magnetic field is formed by cusp magnetic fields based on the outer magnet 15 and the inner magnet 16.

When a negative DC current is applied to the target 13 from a DC power supply unit 19 while introducing an inert gas such as Ar gas or the like into the vacuum chamber 11, the Ar gas is ionized by the electric field to generate electrons. The electrons are drifted by the horizontal magnetic field and the electric field, thereby generating a high-density plasma. Then, the target 13 is sputtered by Ar ions in the plasma, so that metal particles are released from the target 13 and deposition is performed on the substrate 12 by the released metal particles.

With such a mechanism, as shown in FIG. 15, on the bottom surface of the target 13, an annular erosion 17 is formed according to the array of magnets immediately below a middle portion between the outer magnet 15 and the inner magnet 16. In this case, the magnet body 14 is rotated to form the erosion 17 on the entire surface of the target 13. However, in the above-described array of the magnets, it is difficult to uniformly form the erosion 17 in a radial direction of the target 13.

Meanwhile, the in-substrate distribution of the deposition rate depends on the intensity (magnitude of sputtering rate) of the erosion 17 on the surface of the target 13. Therefore, if the uniformity of the erosion 17 is poor as described above, in the case of reducing a distance between the target 13 and the substrate 12 as shown by a dotted line in FIG. 15, the shape of the erosion is reflected as it is, and the in-substrate distribution of the deposition rate is deteriorated. For this reason, conventionally, a sputtering process is performed by setting a distance between the target 13 and the substrate 12 in a range from about 50 mm to 100 mm.

In this case, the particles released from the target 13 by the sputtering are scattered to the outside, so that, if the target 13 is separated from the substrate 12, the amount of sputtered particles adhering to the anti-adhesion shield becomes greater, and the deposition rate at an outer peripheral portion of the substrate is decreased. Therefore, the in-substrate uniformity of the deposition rate is generally ensured by making the erosion of the outer periphery deep, i.e., by increasing the sputtering rate of the outer periphery. However, as described above, in this configuration, since the amount of sputtered particles adhering to the anti-adhesion shield becomes greater, the deposition efficiency is as low as about 10% and a high deposition rate cannot be obtained.

The target 13 needs to be exchanged immediately before the erosion 17 reaches the bottom surface of the target 13.

However, as previously described, if the in-plane uniformity of the erosion 17 is low and there locally exists a site where the progress of erosion is rapid, the utilization efficiency of the target 13 drops to about 40% since the time of replacing the target 13 is determined in accordance with the site. In order to reduce the manufacturing cost and enhance the productivity, it is also necessary to increase the utilization efficiency of the target 13.

Recently, a tungsten (W) film has been recognized as a wiring material for memory devices, and it has been suggested to form a film at a deposition rate of, e.g., about 300 nm/min. In the above-described configuration, it is possible to ensure the deposition rate by increasing the application power to, e.g., about 15 kWh. However, the mechanism becomes complex and the operation rate declines. The manufacturing cost also increases.

Here, in order to ensure the in-plane uniformity of the deposition rate, the in-plane uniformity of the erosion needs to be improved. To do so, it is considered to dispose a plurality of magnets in a planar form. Japanese Patent Application Publication No. 2004-162138 suggests a configuration in which a plurality of magnets having different polarities are alternately arranged equidistantly between any two magnets in a planar form facing the target to generate a point cusp magnetic field below the target.

Further, Japanese Patent Application Publication No. 2000-309867 suggests a technique in which a plurality of magnets each having a central axis parallel to the surface of the target is arranged such that the central axes are substantially in parallel to each other and N poles and S poles of the magnets face each other in a direction substantially perpendicular to the central axes.

In the above arrangement of the magnets, in order to increase the deposition rate, the strength of the magnetic field is increased by reducing the distance between the magnets or increasing the surface magnetic flux density. However, this causes the increase in the repulsion of the magnetic flux and the magnetic flux line to be distorted. Further, an area where a horizontal magnetic field is obtained is decreased. The above-cited references do not disclose an arrangement of magnets through which a horizontal magnetic field is generated in a wide range. Thus, it is difficult to realize the object of the present invention in which the high speed film formation is obtained while ensuring the in-plane uniformity of the deposition rate.

SUMMARY OF THE INVENTION

In view of the above, the present invention provides a technique capable of improving a utilization efficiency of a target and obtaining a high deposition rate while ensuring an in-plane uniformity of a deposition rate.

In accordance with an aspect of the present invention, there is provided a magnetron sputtering apparatus in which a target is disposed to face a substrate to be processed installed in a vacuum chamber and magnets are disposed on a rear surface of the target, including a power supply unit configured to apply a voltage to the target; and a magnet array body including a magnet group arranged on a base body provided at the rear surface of the target; wherein, in the magnet array body, rod-shaped magnets each having different polarities at opposite ends thereof are disposed in a mesh shape on a surface of the base body facing the target; the mesh has a 2n polygonal shape (n being an integer greater than or equal to 2); permeable core members are disposed at intersection points of the mesh which are surrounded by the ends of the rod-shaped magnets; and end portions of the rod-shaped magnets which surround each of the core members have a same polarity.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
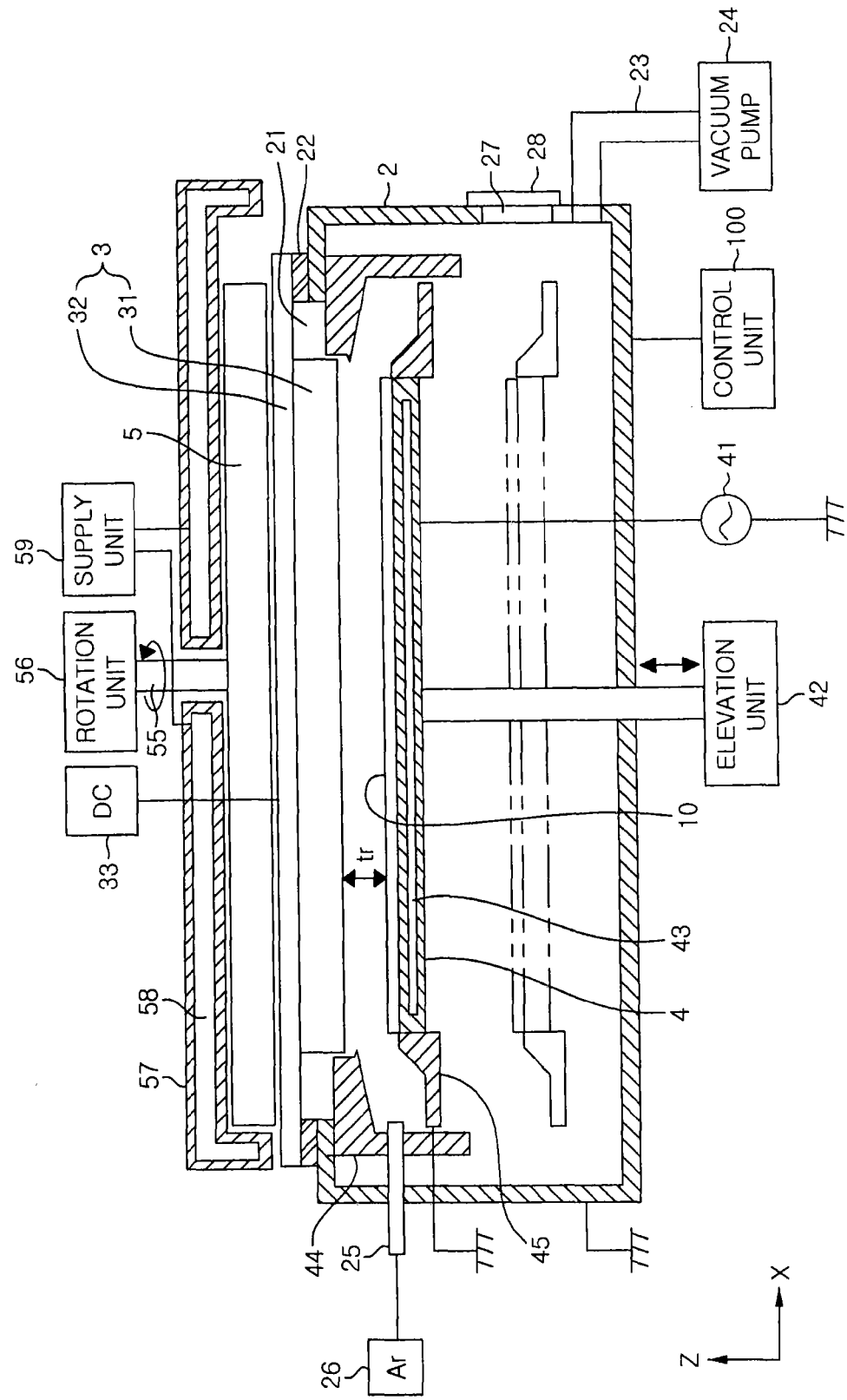
FIG. 1 is a vertical cross sectional view of a magnetron sputtering apparatus in accordance with an embodiment of the present invention.

A magnetron sputtering apparatus in accordance with an embodiment of the present invention will be described with reference to the accompanying drawings which form a part hereof. FIG. 1 is a cross sectional view of one example of the magnetron sputtering apparatus. In FIG. 1, a reference numeral "2" indicates a grounded vacuum chamber 2 made of, e.g., aluminum. The vacuum chamber 2 has a ceiling portion formed with an opening 21, and a target electrode 3 is provided to block the opening 21. The target electrode 3 is formed by connecting a target 31 made of a film forming material, e.g., tungsten (W), to a bottom surface of a conductive base plate 32 made of, e.g., copper (Cu) or aluminum (Al). The target 31 has a circular shape when viewed from above, and a diameter of the target 31 is set in a range from, e.g., about 400 mm to 450 mm, which is larger than that of a semiconductor wafer (hereinafter, referred to as "wafer") as a target substrate to be processed.

The size of the base plate 32 is larger in size than that of the target 31, and a peripheral portion of the bottom surface of the base plate 32 is placed on a peripheral edge portion of the opening portion 21 of the vacuum chamber 2. At this time, an annular dielectric member 22 is provided between the peripheral portion of the base plate 32 and the vacuum chamber 2, so that the target electrode 3 is fixed to the vacuum chamber 2 in an electrically insulated state. Further, a negative DC voltage is applied to the target electrode 3 from a power supply unit 33.

A mounting table 4 for horizontally mounting thereon a wafer 10 is provided in the vacuum chamber 2 so as to face the target electrode 3 in parallel. The mounting table 4 serves as an electrode (facing electrode) made of, e.g., aluminum, and is connected to a high frequency power supply unit 41 for supplying a high frequency power. The mounting table 4 is configured to be moved vertically by an elevation unit 42 between a processing (sputtering) position and a transfer position where a wafer 10 is loaded into and unloaded from the vacuum chamber 2. At the processing position, a distance "h" between a top surface of the wafer 10 on the mounting table 4 and a bottom surface of the target 31 is set in a range from, e.g., about 10 mm to 100 mm, preferably from about 10 mm to 50 mm, and more preferably from about 10 mm to 30 mm.

A heater 43 constituting a heating unit is installed in the mounting table 4, so that the wafer 10 is heated to, e.g., about 400° C. Further, the mounting table 4 is provided with protruding pins (not shown) for transferring the wafer 10 between the mounting table 4 and an external transfer arm (not shown).

In the vacuum chamber 2, an annular chamber shield member 44 and an annular holder shield member 45 are respectively provided so as to surround the lower portion of the target electrode 3 along a circumferential direction of the vacuum chamber 2 and a side portion of the mounting table 4 along the circumferential direction. These members 44 and 45 serve to prevent sputter particles from adhering to an inner wall of the vacuum chamber 2, and are made of a conductive material such as aluminum or aluminum alloy. The chamber shield member 44 is connected to, e.g., an inner wall of the ceiling portion of the vacuum chamber 2, and is grounded through the vacuum chamber 2. Further, the holder shield member 45 is grounded so that the mounting table 4 is grounded through the holder shield unit 45.

Further, the vacuum chamber 2 is connected to a vacuum pump 24 serving as a vacuum exhaust unit through a gas exhaust line 23, and is connected to a gas supply source 26 for supplying an inert gas, e.g., Ar gas, through a gas supply line 25. In the drawing, a reference numeral "27" indicates a transfer port of the wafer 10 which is opened and closed by a gate valve 28.

Figure 2:
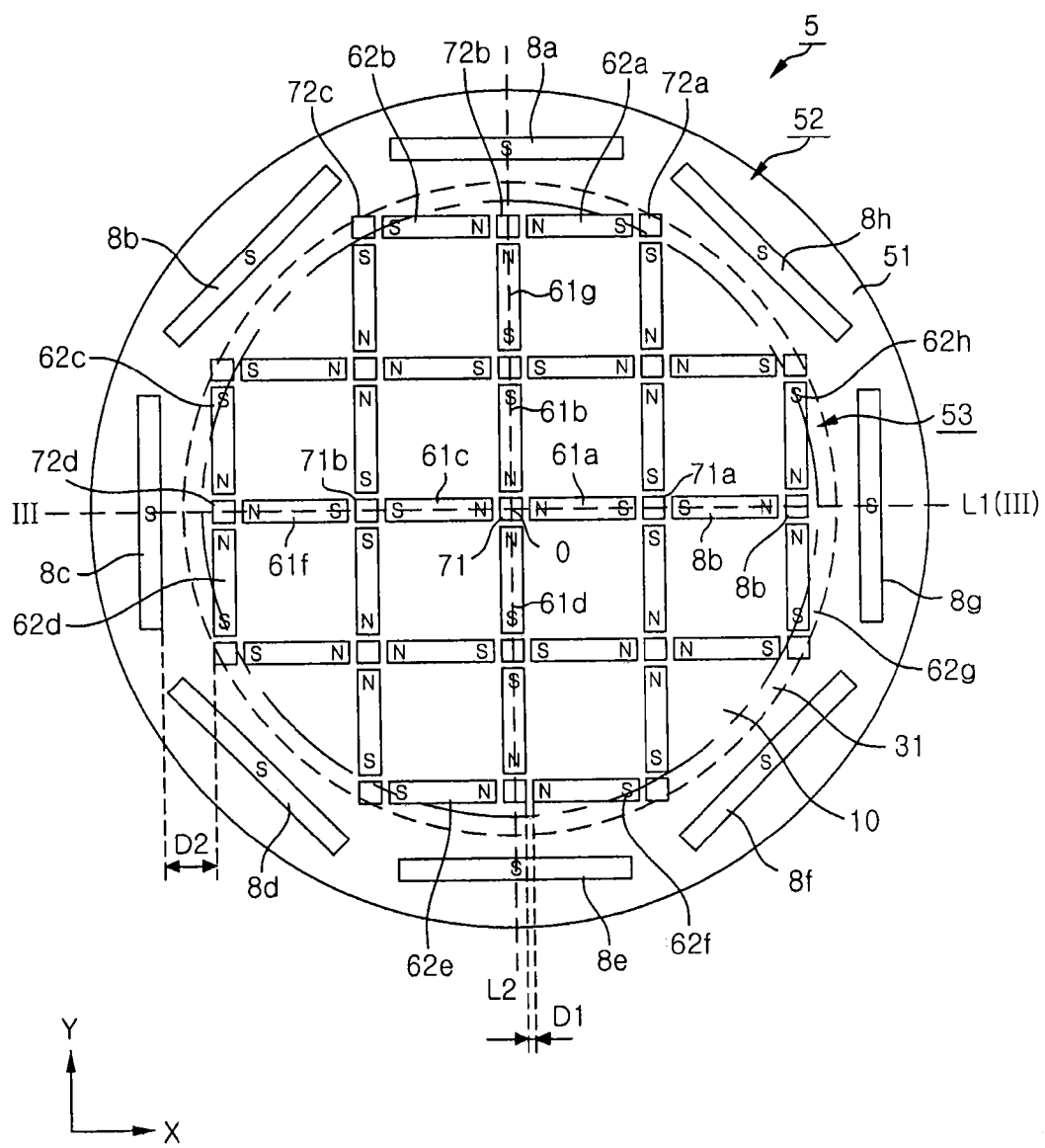
FIG. 2 is a plan view showing an example of a magnet array body of the magnetron sputtering apparatus.
Figure 3:
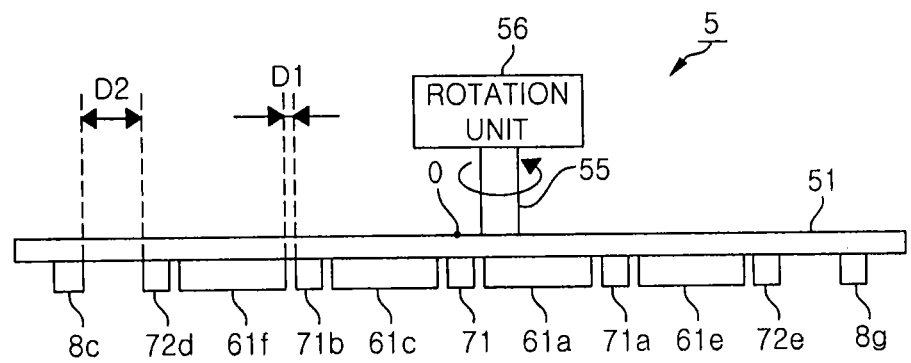
FIG. 3 is a side view of the magnet array body.

A magnet array body 5 is provided in close proximity above the target electrode 3. As shown in FIGS. 2 and 3 (cross sectional view taken along line L1 (III) of FIG. 2), the magnet array body 5 is formed by arranging a magnet group 52 at a base body 51 made of a high relative permeable material, e.g., Fe. FIG. 2 is a plan view of the magnet group 52 seen from the side of the target 31. The base body is provided so as to face the target 31 and has a circular shape larger than the target 31 in a plan view. The base body 51 is disposed in such a way that the center "O" thereof corresponds to the center of the target 31. A diameter of the base body 51 is set to be larger than that of the target 31 by, e.g., about 60 mm.

The magnet group 52 includes: an inner magnet group 53 having rod-shaped magnets 6, each having different polarities at opposite ends, and permeable core members 7 (71, 71a and 71b); and return magnets 8 disposed at an outer side of the inner magnet group 53. The rod-shaped magnets 6, the core members 7 and the return magnets 8 are arranged along a surface of the base body 51 facing the target 31 so that a plasma is generated over the entire projecting area of the wafer 10 based on the drift of electrons by a cusp magnetic field.

The rod-shaped magnets 6 are disposed in a mesh shape along the surface of the base body 51 facing the target 31, and each mesh is formed in a 2n polygonal shape (n being an integer greater than or equal to 2). Further, the core members 7 are provided at areas surrounded by the end surfaces of the rod-shaped magnets 6 at the intersections of the mesh. The end portions of the rod-shaped magnets 6 which surround each of the core members 7 are arranged in such a way as to have a same polarity.

Specifically, the rod-shaped magnets 6 are disposed at the line-shaped portions of the mesh, and the core members 7 are disposed at the intersection portions thereof, as shown in FIG. 2. In this manner, the rod-shaped magnets 6 are disposed in a square shape (2n polygonal shape, n being 2).

Figure 4:
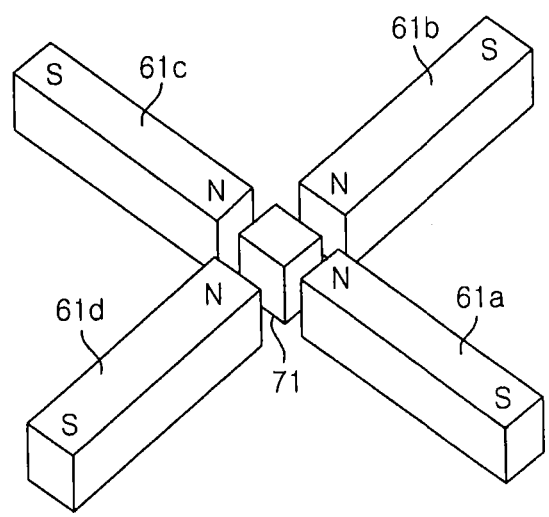
FIG. 4 is a perspective view of a part of rod-shaped magnets and a core member of the magnet array body.

The core members 7 are provided at four intersection points, and the portions of the rod-shaped magnets 4 which surround each of the core members 7 are set to have a same polarity. Hence, as representatively illustrated by the core member 71 in FIG. 4, a plurality of units 60, each of which includes one core member 7 (71) and four rod-shaped magnets 6 (61a to 61d) radially arranged at an interval of about 90° around the core member 7 (71) with a same polarity facing the core member 7 (71), is disposed on a bottom surface (on the side of the target 31) of the base body 51.

In the inner magnet group 53, the rod-shaped magnets 6 and the core members 7 are arranged in such a way as to be rotated about, e.g., the center O of the base body 51. In the example shown in FIG. 2, the core member 71 is provided at the center O, and the rod-shaped magnets 6 are disposed on two lines L1 and L2 orthogonal to each other at the center O.

For example, if the right-left direction of the target is defined as the X direction and the transverse direction of the target 31 is defined as the Y direction in FIG. 2, the line L1 extends in the right-left direction and the line L2 extends in the transverse direction. Further, the rod-shaped magnets 6 have, e.g., a rectangular shape, in a plan view and are arranged such that a longitudinal direction thereof is in parallel to the right-left direction or the transverse direction. Accordingly, a square is formed by four rod-shaped magnets 6.

The core members 7 are made of a permeable material, e.g., Fe. Here, the permeability indicates a relative permeability of about 1000 or above, and the core member 7 may be made of silicon steel, permalloy or the like, in lieu of Fe. The core members 7 are formed in, e.g., a square shape, in a plan view. In this example, the core members 7 are spaced from the rod-shaped magnets 6 by slight gaps. For example, all the rod-shaped magnets 6 have the same shape and the same size, and all the core members 7 have the same shape and the same size. The rod-shaped magnets 6 are spaced from the core members 7 at an equal distance. As such, in this example, the rod-shaped magnets 6 and the core members 7 are arranged in such a way that one core member 7 is surrounded by four rod-shaped magnets 6.

Here, an array of the rod-shaped magnets 6 and the core members 7 is arranged in such a way as to make electrons drift around the core member 7. In order to facilitate the drift of the electrons, it is necessary to generate a high horizontal magnetic field in a wide range. Therefore, it is preferable to minimize the distance between the core members 7 and the rod-shaped magnets 6, and arrange the ends of the rod-shaped magnets 6 surrounding the core members 7 to be spaced from the ends of the core members 7 equidistantly. Here, the equal distance denotes that the distance between the ends of the core members 7 and the ends of the rod-shaped magnets 6 is within about ±10% of an average interval. FIG. 2 shows an example of the magnet array body 5 in which the core members 7 are spaced from the rod-shaped magnets 6. Since, however, it is preferable to minimize the interval between the rod-shaped magnets 6 with the core members 7 therebetween, the core members 7 may be in contact with the rod-shaped magnets 6 to prevent magnetic field leakage. Hence, a distance D1 between the core members 7 and the rod-shaped magnets 6 is set in a range from about 0 mm to 3 mm.

In order to generate a uniform magnetic field, it is preferable to arrange the ends of the rod-shaped magnets 6 surrounding the core members 7 to be spaced from the centers of the core members 7 equidistantly. Therefore, in the above example, the rod-shaped magnets 6 are radially arranged in four directions around the core members 7. Accordingly, the core members 7 are formed in a square shape, and the length of one side of each of the core members 7 is the same as the width of the rod-shaped magnets 6.

For example, the rod-shaped magnets 6 have a length ranging from about 10 mm to 50 mm, a width ranging from about 5 mm to 20 mm, and a height ranging from about 5 mm to 20 mm. The core members 7 have a length ranging from about 5 mm to 20 mm and a height ranging from about 5 mm to 20 mm. At this time, in order to reduce the leakage of the magnetic field, opposite ends of the rod-shaped magnets 6 preferably have the same cross sectional shapes as those of opposite ends of the core members 7 which correspond to the rod-shaped magnets 6. However, the shapes of the opposite ends need not necessarily be the same.

The return magnets 8 are disposed at an outermost periphery of the magnet group 52 in a line shape in order to prevent electrons from being released from the binding of the cusp magnetic field and escaping to the outside of the cusp magnetic field. Here, if outermost rod-shaped magnets among the inner magnet group 53 are referred to as outer magnets 62, magnets 62a to 62h correspond to the outer magnets in the configuration shown in FIG. 2. In this example, a pair of the outer magnets 62a and 62b and a pair of the outer magnets 62e and 62f are arranged in parallel along the right-left direction, and a pair of the outer magnets 62a and 62b and a pair of the outer magnets 62e and 62f are arranged in parallel along the transverse direction.

For example, some of eight return magnets 8 (8a to 8h) are provided in parallel along the right-left direction or the transverse direction in such a way as to correspond to the pairs of the outer magnets 62, and the return magnets 8 that do not correspond to the pairs of the outer magnets 62 are arranged slantingly. As a consequence, the return magnets 8 are arranged in a substantially octagonal form around the inner magnet group 53 while being spaced apart from each other.

Each of the return magnets 8 has a rectangular shape in a plan view. For example, the return magnet 8a among the return magnets 8 corresponding to the pairs of the outer magnets 62 is positioned in such a way that the longitudinal center of the return magnet 8a corresponds to the core member 72b disposed between the outer magnets 62a and 62b and the longitudinal ends of the return magnet 8a are disposed at more inward positions than the core members 72a and 72c provided at opposite ends of the outer magnets 62a and 62b, respectively.

Further, the return magnet 8a has a polarity opposite to the polarity of the end surfaces of the rod-shaped magnets 62a and 62b surrounding the core member 72b positioned at the center therebetween. In this example, the return magnet 8a is set to have an S pole. FIG. 2 shows the magnet array body 5 seen from the side of the target electrode 3. The side of the return magnet 8a which faces the target electrode 3 is set to have an S pole, and the side of the return magnet 8a which faces the base body 51 is set to have an N pole. The return magnets 8 facing the outermost magnets 62 of the inner magnet group 53 are spaced from the outer magnets 62 by an equal interval D2.

The magnet group 52 is arranged such that a peripheral portion of the wafer 10 is positioned more inward than a movement area of the drifting electrons. It is clear through a simulation that the uniform distribution of the deposition rate is obtained when the inner magnet group 53 is spaced apart from the return magnet 8 at the area positioned more outward than the periphery of the wafer 10 by about 50 mm. For that reason, it is preferable to employ the above configuration.

If the periphery of the target 31 is set to be positioned between the inner magnet group 53 and the return magnets 8, a horizontal magnetic field caused by the return magnets 8 covers the outer periphery of the target 31, so that an erosion can be formed over the entire surface of the target 31. Further, if the area where the magnets are located is larger than that of the target 31, abnormal discharge may occur. However, abnormal discharge can be prevented by balancing magnetic flux of the return magnets 8 with that of the rod-shaped magnets 6 of the inner magnet group 53.

The surface magnetic flux densities of the return magnets 8 and the inner magnet group 53 are controlled such that the magnetic flux of the return magnets 8 is balanced with the magnetic flux of the outer magnets 62 of the inner magnet group 53 corresponding thereto. Further, in order to obtain stable discharge, a strength of a horizontal magnetic field (magnetic flux density) is preferably set within a range from, e.g., about 100 G to 300 G,. The magnetic flux density is properly designed in accordance with a size of the rod-shaped magnets 6, a surface magnetic flux density, and the number of arrays of the rod-shaped magnets 6, the distance D1 between the core member 7 and the rod-shaped magnets, the distance D2 between the return magnets 8 and the inner magnet group 53, a rotation eccentric amount to be described later, and/or the like.

As will be described later, each of the return magnets 8 and the inner magnet group 53 is ionized. Although the return magnets 8 and the inner magnet group 53 are ionized at different rates, the strength of the ionization can be controlled by adjusting the size and/or the magnetic flux density of the return magnets 8, and the interval D2 between the return magnets 8 and the inner magnet group 53.

The magnet array body 5 is designed in such a way that a uniform magnetic field is generated immediately below the target 31 by controlling various conditions such as the shape the size and/or the arrangement interval of the rod-shaped magnets 6 and/or the core member 7, and/or the like. Although FIG. 2 shows the relative dimensions of the magnet group 52, the wafer 10 and the base body 51, the magnet group 52 merely serves as a member of a configuration example. The installation numbers of the rod-shaped magnets and the return magnets 8 may be properly adjusted in accordance with the size of the wafer 10.

As a design example, a return magnet 8 having a cross section of about 10 mm×20 mm and a length of about 120 mm is employed. In that case, the surface magnetic flux density thereof is about 2 kG to 3 kG. However, the magnetic density of the outer magnets of the inner magnet group 53 can be optimized by controlling the size or the number of the stacked return magnets 8. Further, the distance D2 between the outermost magnets 62 of the inner magnet group 53 and the return magnets 8 is set in a range from, e.g., about 5 mm to 30 mm.

In addition, for example, the rod-shaped magnets 6 and the return magnets 8 which constitute the magnet group 52 have the same height, and the bottom surfaces of the magnets have the same height position. Further, the interval between the bottom surfaces of the magnets 6 and 8 and the top surface of the target 31 is set in a range from, e.g., about 15 mm to 40 mm. However, it is not necessary to identically set the heights of the rod-shaped magnets 6, the core members 7 and the return magnets 8.

The top surface of the base body 51 of the magnet array body 5 is connected to a rotation unit 56 through a rotation shaft 55, and the magnet array body 5 is rotatable by the rotation unit 56 about an axis perpendicular to the wafer 10. In this example, the rotation shaft 55 is disposed at a position eccentric from the center O of the base plate 51, as shown in FIG. 3. At this time, in order to form the erosion over the entire surface of the target 31, it is preferable to set an eccentric distance in such a way that the outer circumference of the target 31 is located at a position more inward than the magnet group 52 even when the eccentric rotation is carried out. Thus, in this example, the rotation shaft 55 is disposed at a position eccentric from the center O of the base plate 51 by about 20 mm to 30 mm.

A cooling jacket 57 forming a cooling unit is provided around the magnet array body 5 so as to cover the top surface and the side surface of the magnet array body 5 within the rotation area of the magnet array body 5. The cooling jacket 57 has therein a coolant path 58. By circulating a coolant medium, e.g., cooling water, supplied from a supply unit 59 through the path 58, the magnet array body 5 is cooled and the target electrode 3 is cooled via the magnet array body 5, the temperature of the coolant medium being controlled to a predetermined level.

The magnetron sputtering apparatus having the above-described configuration includes a control unit 100 for controlling a power supply operation from the power supply unit 33 or the high frequency power supply unit 41, an Ar gas supply operation, an elevation operation of the mounting table 4 by the elevation unit 42, a rotation operation of the magnet array body 5 by the rotation unit 56, an operation of exhausting the vacuum chamber 2 by the vacuum pump 24, a heating operation by the heater 43, or the like. The control unit 100 includes, e.g., a computer having a CPU (not shown) and a storage unit. The storage unit stores a program including control steps (commands) required to form a film on the wafer W by the magnetron sputtering apparatus. The program is stored in a storage medium, e.g., a hard disk, a compact disk, a magneto-optical disk, a memory card or the like and installed from the storage medium into the computer.

Hereinafter, an operation of the magnetron sputtering apparatus will be described. First, the transfer port 27 of the vacuum chamber 2 is opened, and the mounting table 4 is located at a transfer position. Then, the wafer 10 is transferred onto the mounting table 4 by cooperation of an external transfer unit and the protruding pins (not shown). Next, the transfer port 27 is closed, and the mounting table 4 is raised to a processing position. Thereafter, Ar gas is introduced into the vacuum chamber 2 and, also, the vacuum chamber 2 is evacuated by the vacuum pump 24 so as to be maintained at a predetermined vacuum level raging from, e.g., about 0.665 Pa to 13.3 Pa (about 5 mTorr to 100 mTorr).

Meanwhile, while the magnet array body 5 is rotated by the rotating unit 56, a negative DC voltage ranging from about 100 W to 3000 W is applied from the power supply unit 33 to the target electrodes 3, and a high frequency voltage ranging from about several hundreds of KHz to several hundreds of MHz is applied from the high frequency power supply unit 41 to the mounting table 4 at a power level ranging from about 10 W to 1000 W. Moreover, cooling water is constantly circulated in the path 58 of the cooling jacket 57.

When a DC voltage is applied to the target electrode 3, Ar gas is ionized by a thus-generated electric field, thereby generating electrons. Meanwhile, by the magnet group 52 of the magnet array body 5, cusp magnetic fields are generated between the rod-shaped magnets 6 of the inner magnet group 53 and between the return magnets 8 and the outer magnets 62 of the inner magnet group 53. By the action of the cusp magnetic field, a horizontal magnetic field is successively generated near the surface (surface to be sputtered) of the target 31.

Accordingly, magnetron discharge is generated by the horizontal magnetic field and the electric field generated near the target 31. Further, the electrons are accelerated and drifted in a direction of E×B by the horizontal magnetic field B and the electric field E generated near the target 31. The electrons which are supplied with a sufficient energy by the acceleration collide with Ar gas to be ionized. As a consequence, a plasma is generated.

Figure 5:
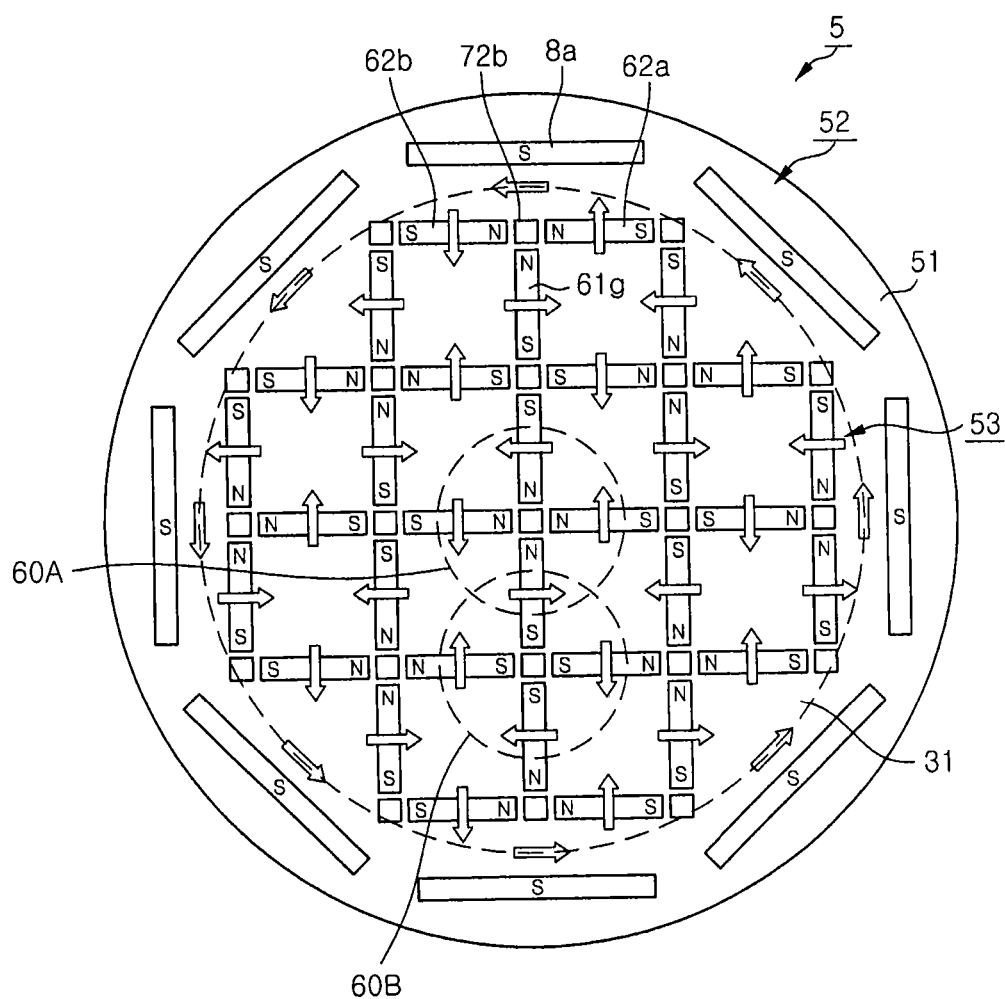
FIG. 5 is a plan view of the magnet array body.

FIG. 5 schematically shows an electron drift direction. For example, in a unit 60A of the rod-shaped magnets 6 in which the core member 7 is surrounded by N poles, the electrons are drifted in such a way as to rotate the core member 7 in a counterclockwise direction. In a unit 60B of the rod-shaped magnets 6 in which the core member 7 is surrounded by S poles, the electrons are drifted in such a way as to rotate the core member 7 in a clockwise direction.

Figure 6A:
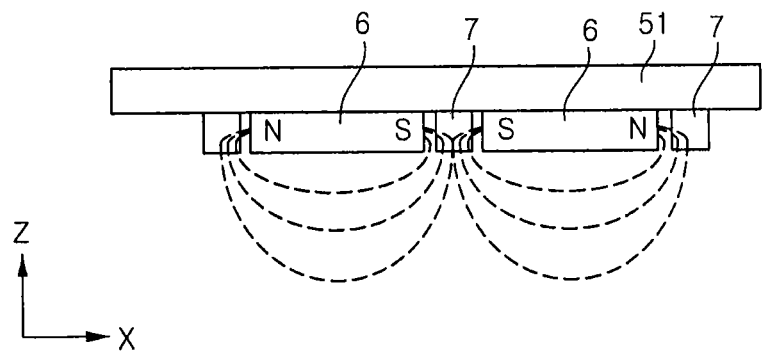
FIGS. 6A to 6C are side views showing an action of the magnet array body.

At this time, in the inner magnet group 53, the rod-shaped magnets 6 are adjacent to each other with the core member 7 therebetween. Since, however, the core member 7 is permeable and has a high relative permeability, the magnetic fluxes from the opposite ends of the rod-shaped magnets 6 pass through the core member 7 as indicated by dotted lines of FIG. 6A. Further, the core member 7 is in contact with or positioned close to the rod-shaped magnets 6, so that new magnetic fluxes emit from the core member 7 and a high horizontal magnetic field is generated below the intersection area where the core member 7 is provided.

As such, by providing the core member 7, the magnetic field can be generated in the intersection area. As a result, the horizontal magnetic field is generated by the rod-shaped magnets 6 in a wide range along a longitudinal direction and a vertical direction (Z axis direction in FIG. 6A) of the magnets.

In accordance with the layout of the magnet group 52 of this example, a peripheral portion of the wafer 10 is positioned more inward than the movement area of the drifting electrons, as described above. Therefore, when the magnet array body 5 is not rotated, a plasma is generated in the entire projection area of the wafer 10 by the drift of the electrons. The drifting electrons are accelerated around all the core members 7 to repetitively collide with Ar gas. Thus, the Ar gas is ionized, and the target 31 is sputtered by the Ar ions in the plasma. Secondary electrons generated by the sputtering are captured by the horizontal magnetic field and drifted, thereby contributing to the ionization of the entire area where the inner magnet group 53 is provided.

As such, the rod-shaped magnets 6 are arranged in a mesh shape, and the permeable core members 7 are provided at the area surrounded by the end surfaces of the rod-shaped magnets 6 at the intersections of the mesh. Moreover, the magnet array body 5 is formed such that the ends of the rod-shaped magnets 6 surrounding the corresponding core member 7 have the same polarity. Accordingly, the magnetic field can be attracted to the intersection area where the core member 7 is provided, and a horizontal magnetic field can be formed in a wide range. In the horizontal magnetic field, the drift movement becomes strong and the electron density is increased. Thus, by generating a horizontal magnetic field in a wide range, it is possible to generate a high-density plasma immediately below the target 31 while ensuring in-plane uniformity. Besides, since the plasma density is increased, a high deposition rate can be obtained.

Figure 6B:
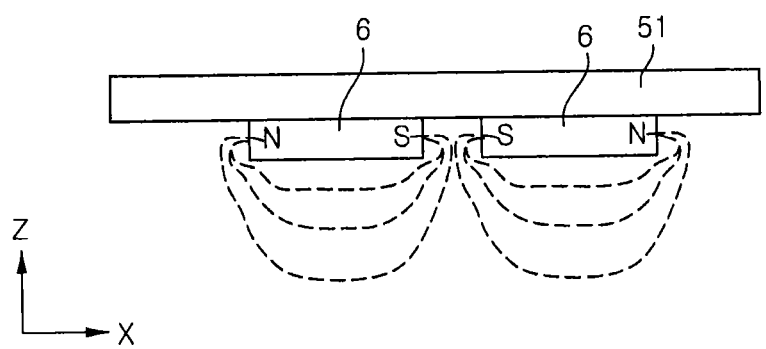
Figure 6C:
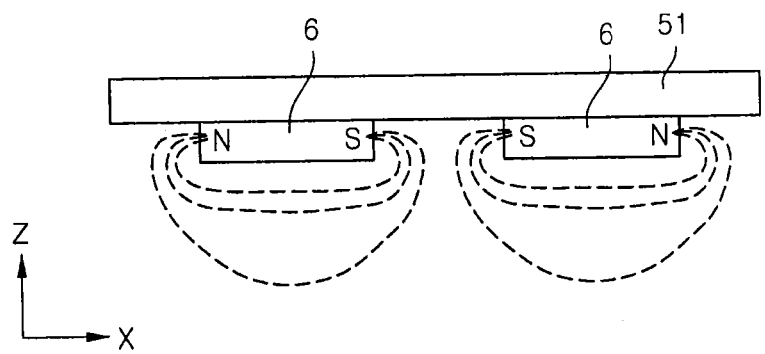

Meanwhile, when no core member 7 is provided, if the rod-shaped magnets 6 are positioned close to each other, the repulsive force between the magnetic fluxes thereof is increased and the magnetic flux lines are distorted toward the rod-shaped magnets 6, as shown in FIG. 6B. Therefore, the magnetic field is distorted below the intersection area, so that it is difficult to generate a high horizontal magnetic field. If the rod-shaped magnets 6 are spaced from each other, the repulsive force between the magnetic fluxes thereof is decreased and the distortion of the magnetic field is reduced, as shown in FIG. 6C. However, the magnetic field becomes weak below the intersection areas. Further, the magnetic field in a vertical direction is reduced, so that it is difficult to obtain a strong magnetic field.

As such, by merely arranging the rod-shaped magnets 6 in a mesh shape, the horizontal magnetic field generation area is reduced, so that the drift movement of electrons becomes weak. As a result, since a high plasma density is not obtained, it is difficult to obtain a high deposition rate.

Further, in the above example, the return magnets 8 are provided, and thus the electrons are prevented from being released from the binding of the cusp magnetic field and escaping to the outside of the cusp magnetic field. For example, the return magnet 8a is formed in a band shape extending linearly as described above. Hence, the core member 72b is surrounded by the rod-shaped magnets 62a, 62b and 61g and the return magnet 8a. Further, the magnetic flux of the magnetic field caused by the return magnet 8a and the magnetic flux of the magnetic field caused by the rod-shaped magnets 62a, 62b and 61g are combined, so that the electrons are moved along the cusp magnetic field and drifted around the core member 72b in a counterclockwise direction. Then, the electrons are returned to the area formed by the rod-shaped magnets 6 (the inner magnet group 53).

As such, by providing the return magnets 8, the ionization occurs between the return magnets 8 and the inner magnet group 53. This contributes to the ionization of the entire area where the inner magnet group 52 is provided. Accordingly, a high-density plasma can be generated while ensuring in-plane uniformity.

As a result, by repeating the ionization of Ar gas, Ar ions are generated, and the target 31 is sputtered by the Ar ions. As a consequence, tungsten particles sputtered from the surface of the target 31 are scattered in the vacuum chamber 2, and these particles are adhered to the surface of the wafer 10 on the mounting table 4. As a result, a thin film of tungsten is formed on the wafer 10. Further, the particles deviating from the wafer 10 are adhered to the chamber shield member 44 or the holder shield member 45. At this time, since a high frequency power is applied to the mounting table 4, Ar ions are attracted to the wafer 10, and thus a dense thin film having a low resistivity is formed by a synergistic effect with the heating by the heater 43.

As described above, the erosion of the target 31 is formed at a central portion (the center and near the center) between the magnets having different polarities. Since, however, the rod-shaped magnets 6 are arranged in a mesh shape in the magnet array body 5, erosion occurs at a large number of locations periodically on the entire surface of the target 31. Further, the plasma density can become uniform over the entire projection area of the wafer 10 as described above, so that the erosions proceed at the same rate. In this regard, the in-plane uniformity is improved.

At this time, in order to enhance the uniformity of the erosion, the magnet array body 5 is rotated about a vertical axis by the rotation unit 56. From a microscopic viewpoint, although the plasma density has variation caused by the horizontal magnetic field, the plasma density becomes uniform by rotating the magnet array body 5. In the present embodiment, the magnet array body 5 is rotated about an axis eccentric from the center of the base body 51, so that the uniformity of the distribution of the deposition rate is further improved.

In other words, when the magnet array body 5 is not rotated, the horizontal magnetic field is not generated below the magnet array body 5. Accordingly, the ionization does not occur and the area where sputtering occurs is periodically formed with difficulty. Therefore, when viewed from a diametrical direction of the magnet array body 5, the distribution of the deposition rate has a shape in which small irregularities are formed at a regular interval. Hence, by eccentrically rotating the magnet array body 5, the irregularities are compensated, thereby obtaining a more uniform distribution of the deposition rate.

As such, the in-plane uniformity of the erosion is high, so that the sputtering can be performed when the wafer is positioned near the target 31. Accordingly, the particles sputtered from the target 31 smoothly adhere to the wafer 10, and the number of sputter particles which contribute to the film formation on the wafer 10 is increased, which results in a high deposition efficiency.

Figure 7:
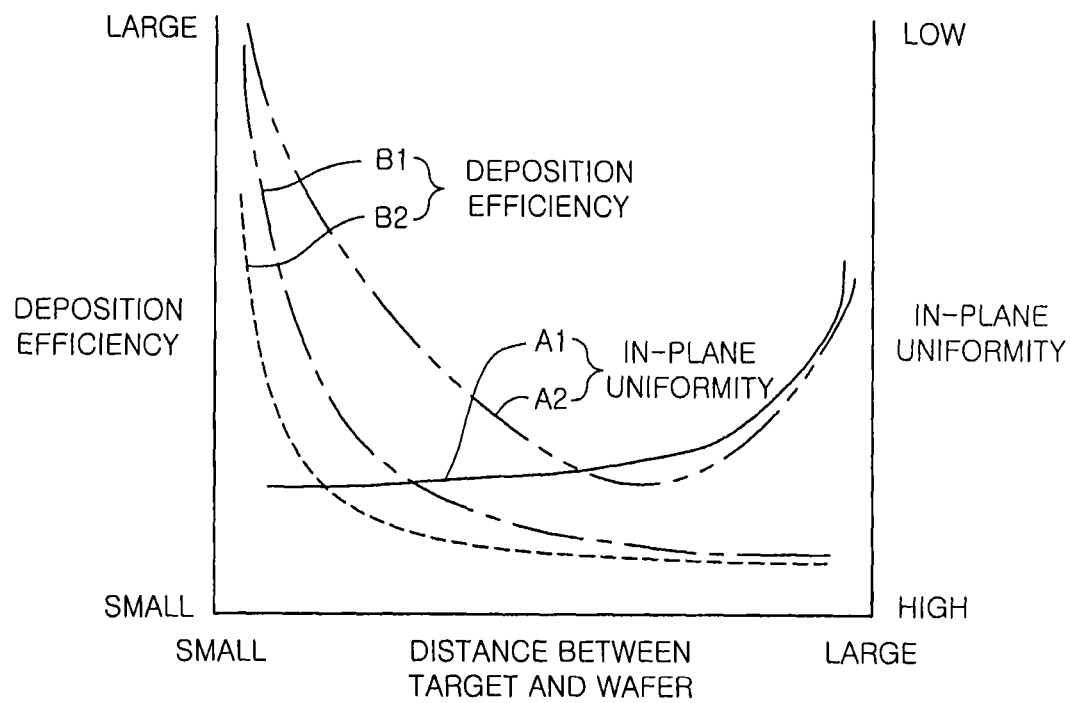
FIG. 7 is a graph showing relationships among a distance between a target and a substrate, a deposition efficiency, and an in-plane uniformity of a deposition rate.
Figure 13:
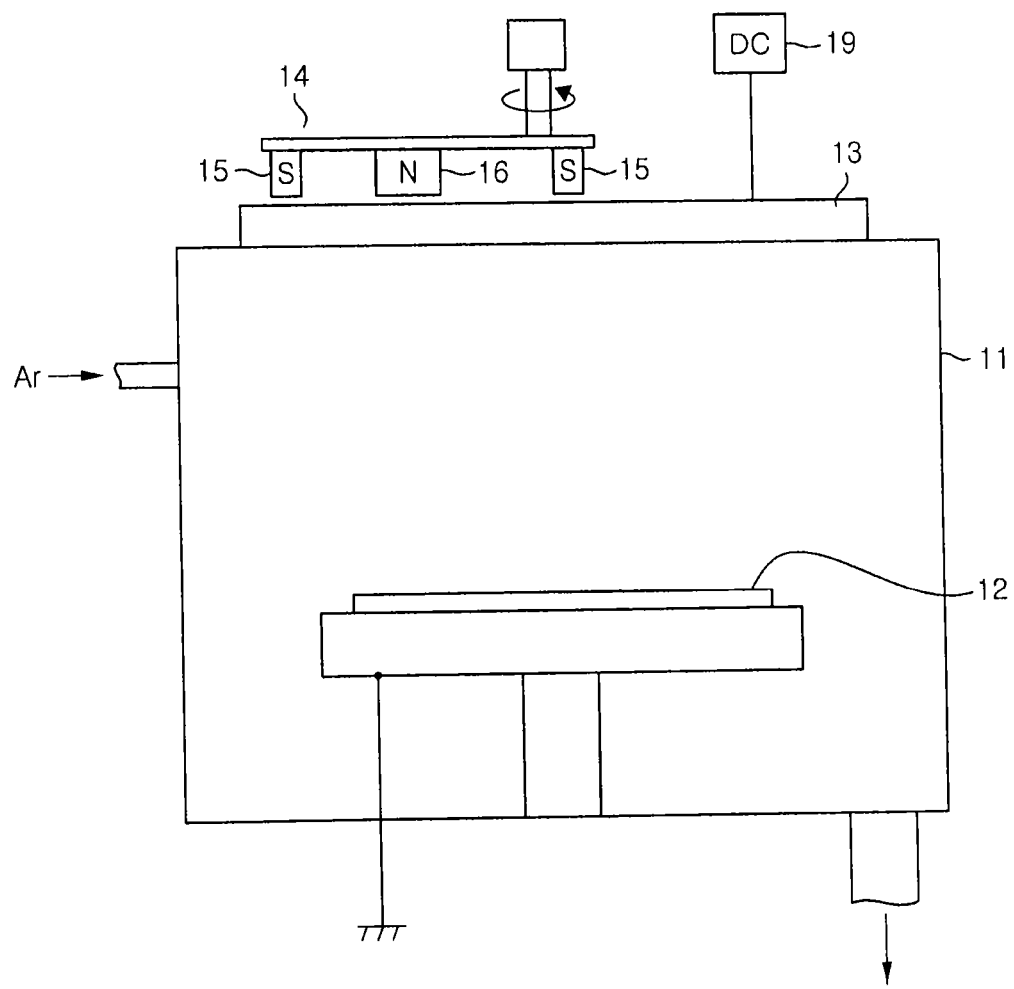
FIG. 13 is a vertical cross sectional view of a conventional magnetron sputtering apparatus.
Figure 14:
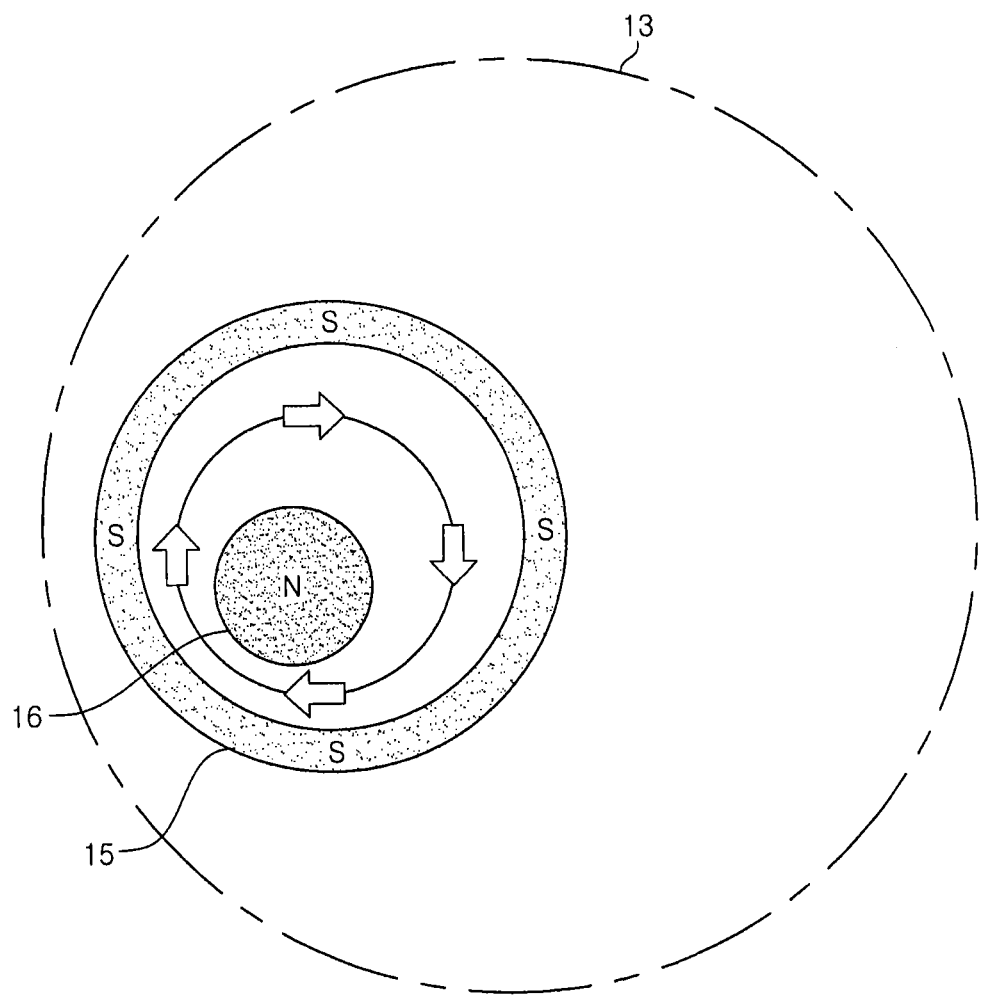
FIG. 14 is a plan view of a magnet body used in the conventional magnetron sputtering apparatus.
Figure 15:
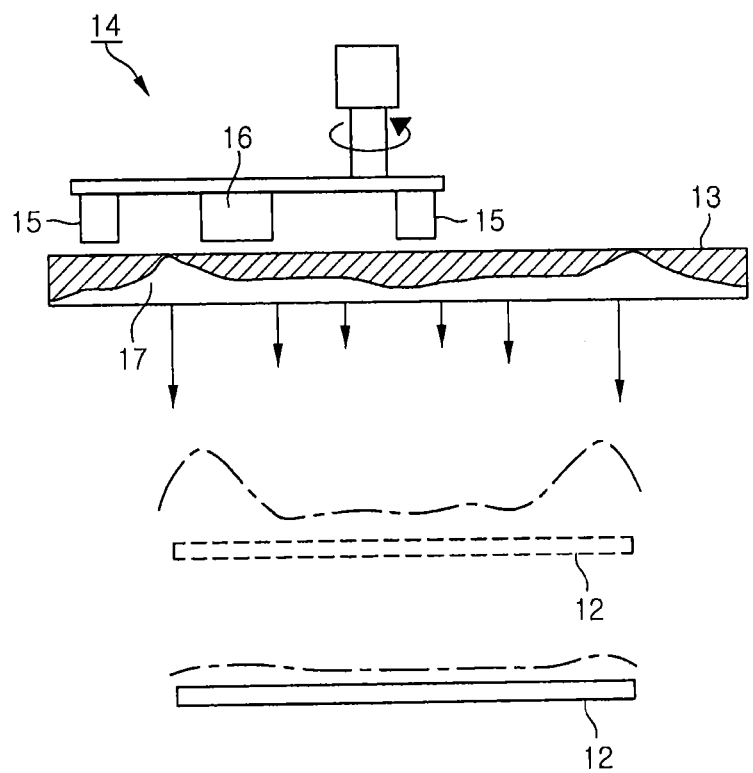
FIG. 15 is a vertical cross sectional view for explaining an action of the conventional magnetron sputtering apparatus.

FIG. 7 shows relationships among the distance between the target 31 and the wafer 10, the deposition efficiency and the in-plane uniformity of the deposition rate. The horizontal axis indicates the distance between the target 31 and the wafer 10, the left vertical axis indicates the film forming rate, and the right vertical axis indicates the in-plane uniformity of the deposition rate. The in-plane uniformity of the deposition rate indicated by a solid line A1 corresponds to the data of the configuration in accordance with the embodiment of the present invention, and that indicated by a dashed double dotted line A2 corresponds to the data of a conventional configuration (the configuration shown in FIG. 13). Further, the deposition efficiency indicated by a dashed dotted line B1 corresponds to the data of the configuration in accordance with the embodiment of the present invention, and that indicated by a dotted line B2 corresponds to the data of the conventional configuration.

In accordance with the embodiment of the present invention, the in-plane uniformity is improved as the distance between the target 31 and the wafer 10 is reduced and is deteriorated as the distance therebetween is increased. Further, the deposition efficiency is improved as the distance between the target 31 and the wafer 10 is reduced and is deteriorated as the distance therebetween is increased. As such, in the configuration in accordance with the embodiment of the present invention, the in-plane uniformity of the deposition rate and the deposition efficiency are both improved as the distance between the target 31 and the wafer W is reduced. However, if the target 31 is excessively close to the wafer 10, the plasma generation space is considerably reduced, and thus the discharge occurs with difficulty. Therefore, the distance between the target 31 and the wafer 10 is preferably set in a range from about 10 mm to 50 mm and more preferably from about 10 mm to 30 mm.

Conventionally, the in-plane uniformity of the deposition rate is decreased as the distance between the target 31 and the wafer 10 is decreased and is improved as the distance therebetween is increased. Further, the in-plane uniformity of the deposition rate is reduced again when the distance exceeds a predetermined level. Therefore, in order to ensure a high in-plane uniformity, the distance between the target 31 and the wafer 10 needs to be increased. However, if the distance is increased, the deposition efficiency is considerably reduced compared to the configuration in accordance with the embodiment of the present invention.

In accordance with the above embodiment, the magnet array body 5 is configured in such a way that the rod-shaped magnets 6 are arranged in a mesh shape and the permeable core members 7 are disposed at the intersections of the mesh which are surrounded by the end surfaces of the rod-shaped magnets 6 in a state where the ends of the rod-shaped magnets 6 which surround the core members 7 have the same polarity. Therefore, a horizontal magnetic field can be generated in a wide range, as described above. Accordingly, a high-density plasma can be uniformly generated in a wide area, and thus a high deposition rate can be obtained while ensuring an in-plane uniformity of the deposition rate.

Further, the in-plane uniformity of the erosion formed at the target by the horizontal magnetic field of the magnets is improved, and the erosion proceeds uniformly in the entire surface. As a result, the lifespan of the target 31 can be increased, and the utilization efficiency of the target 31 can be improved.

When the return magnets 8 are provided, loss of electrons can be suppressed. Hence, the in-plane uniformity of the deposition rate is further enhanced, so that a high deposition rate is obtained. Moreover, when the magnet array body 5 is rotated, the in-plane uniformity of the erosion can be further enhanced, and thus the in-plane uniformity of the deposition rate is further improved. When the distance between the target 31 and the wafer 10 is set to be about 50 mm or less, the number of sputter particles contributing to the film formation on the wafer 10 is increased. Accordingly, the deposition rate is increased, and thus the deposition efficiency is improved. In addition, the in-plane uniformity of the deposition rate is enhanced as shown in FIG. 7.

It was actually proven that, when a W film was formed on the wafer W having a size of about 300 mm while setting a gap between the wafer 10 and the target 31 in a range from about 10 mm to 50 mm under the above-described conditions, the deposition rate of about 400 nm/min was obtained and a good in-plane uniformity of the deposition rate ranging from about 1% to 3% was obtained. When a W film having a thickness of about 50 nm was formed at a deposition rate of about 300 nm/min while setting the distance between the target 31 and the wafer 10 to about 20 mm, a power of about 4 kWh was applied. In that case, the film forming rate was increased to about 300% to 400% compared to the case of using a conventional magnetron sputtering apparatus shown in FIG. 13. Thus, it is possible to reduce power consumption and realize cost saving. In addition, the utilization efficiency of the target 31 is increased to about 80%, so that cost saving can be realized.

Figure 8:
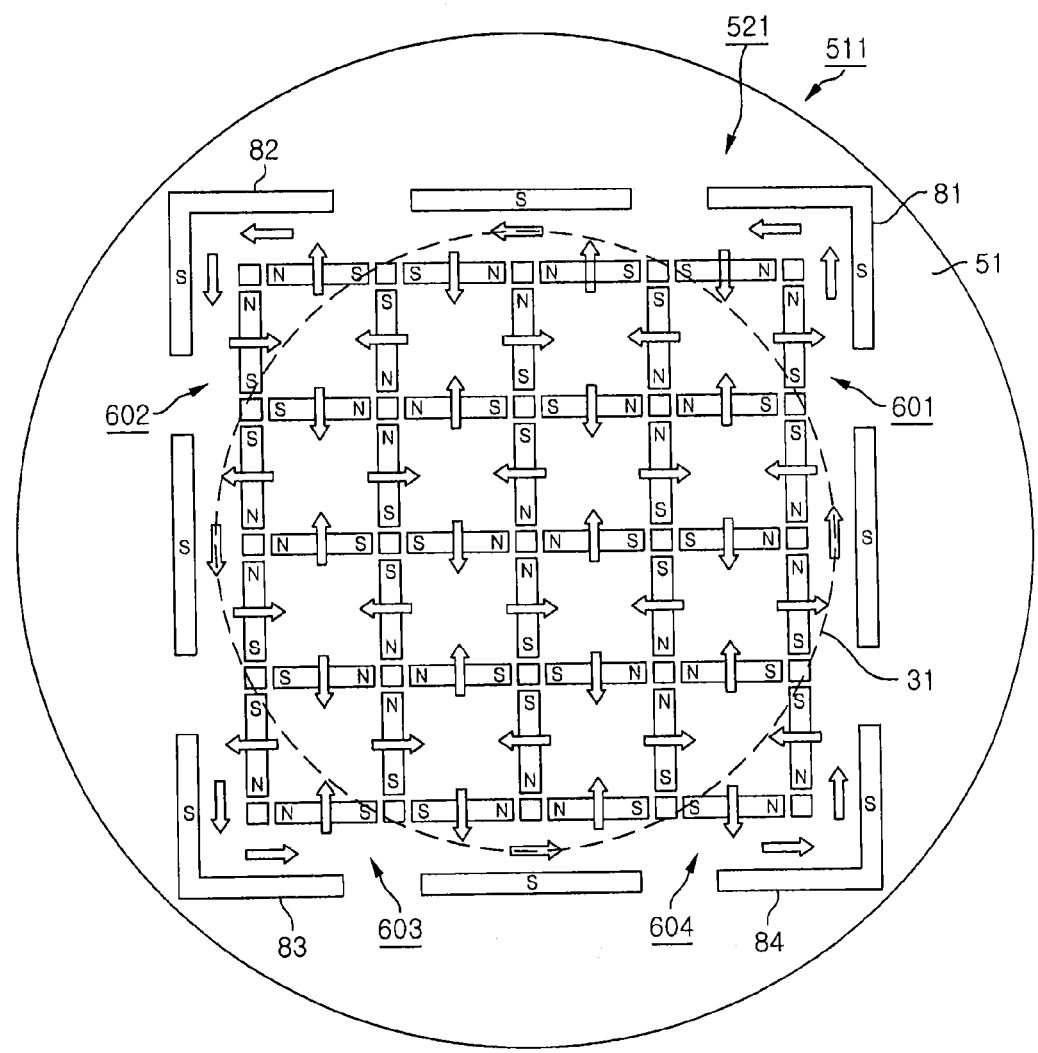
FIG. 8 is a plan view of a first modified example of the magnet array body.

Next, a first modified example of the magnet array body 5 will be described. In a magnet array body 511, a magnet group 521 shown in FIG. 8 is formed by additionally providing units 601 and 602, each being formed of the rod-shaped magnets 6 and the core members 7, at corner portions thereof and substantially L-shaped return magnets 81 to 84 around the units 601 and 602 formed at the corner portions. Arrows in FIG. 8 represent electron drift directions. The other configurations are the same as those of the magnet array body 5 of FIG. 2.

In the above configuration, the escape of electrons is suppressed by the return magnets 81 to 84 at the corner portions, so that the loss of electrons can be efficiently suppressed. Therefore, in this example as well as the above example, a uniform plasma may be generated over the projection area of the wafer 10 immediately below the target 31, and high in-plane uniformity of the erosion is obtained. Accordingly, the deposition rate can be increased while ensuring in-plane uniformity of a high deposition rate, thereby improving the utilization efficiency of the target 31.

Figure 9:
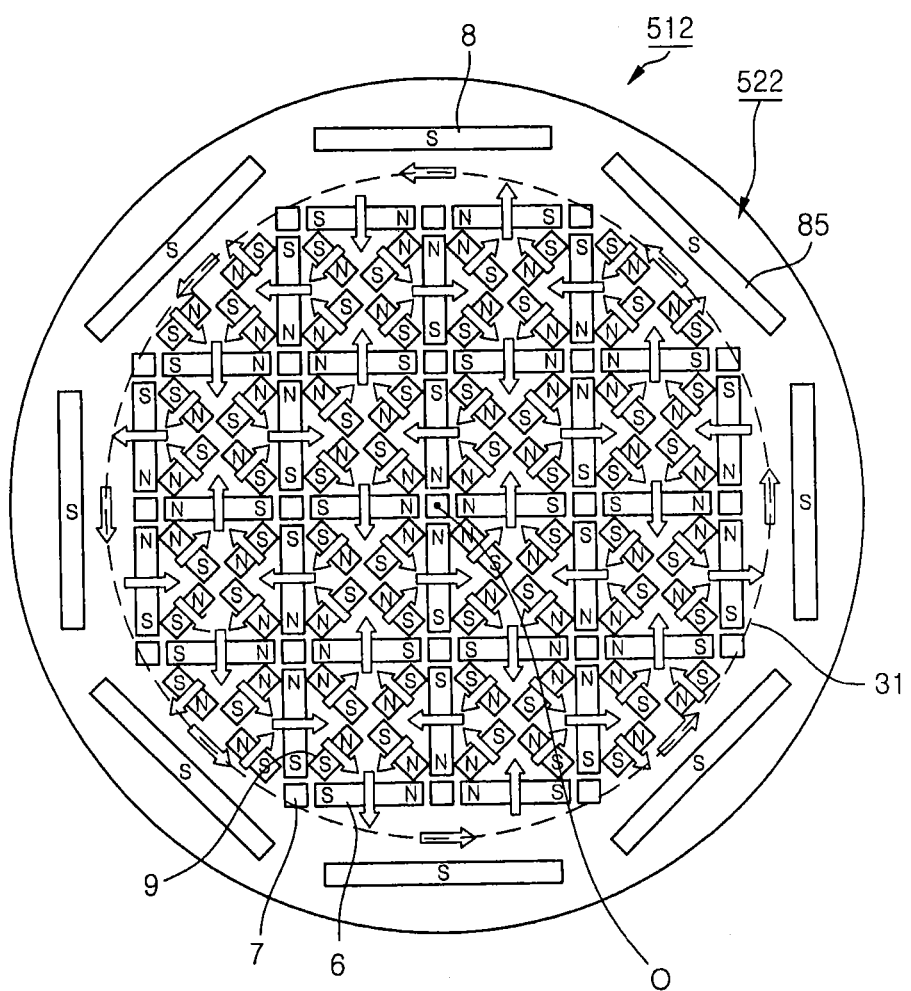
FIG. 9 is a plan view of a second modified example of the magnet array body.
Figure 10:
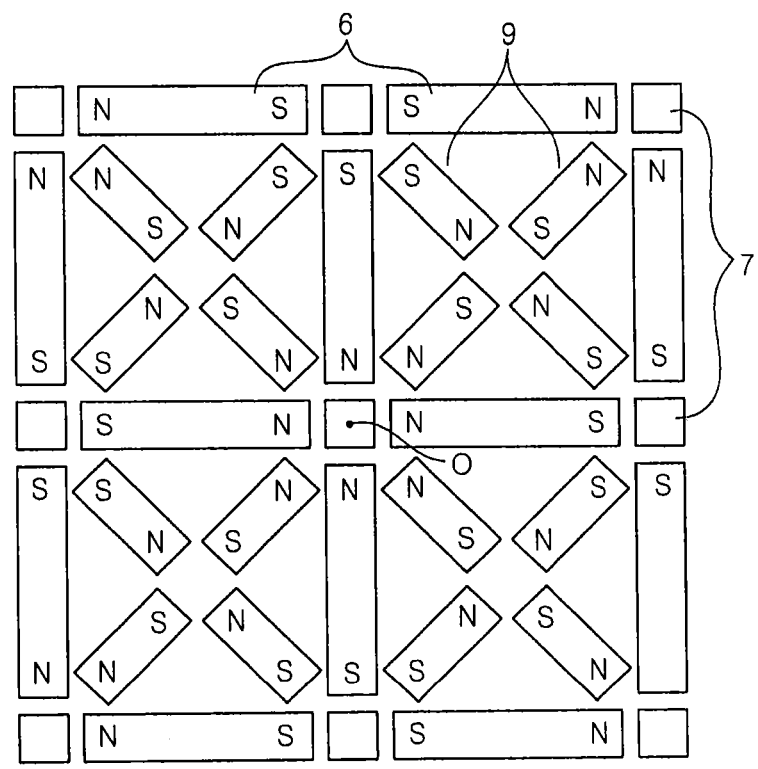
FIG. 10 is a plan view showing a part of the magnet array body.

FIG. 9 shows a second modification example of the magnet array body 5 in which drift of electrons is facilitated by a magnet group 522. In the magnet group 522 of a magnet array body 512, the rod-shaped magnets are disposed in eight directions around one core member 7 (711) as illustrated in FIG. 10 which provides an enlarged view of the central portion thereof. The rod-shaped magnets include main rod-shaped magnets 6 forming a 2n polygonal shape (in this example, a square shape, n being 2) together with the core member 7; and auxiliary rod-shaped magnets 9 shorter than the main rod-shaped magnets 6. The main rod-shaped magnets 6 and the core member 7 are arranged in the same layout as that shown in FIG. 2. The auxiliary rod-shaped magnets 9 are disposed between the main rod-shaped magnets 6, the ends of the auxiliary rod-shaped magnet 9 which surround the core member 7 are set to have the same polarity.

In this manner, the main rod-shaped magnets 6 and the subsidiary rod-shaped magnets 9 are disposed around the core member 7 at an equal interval, and the auxiliary rod-shaped magnets 9 are arranged in such a way that two of them on each diagonal of the square formed by the main rod-shaped magnets 6 with the longitudinal directions thereof being aligned in the same direction. Further, return magnets 85 are provided at the outer side of the outmost auxiliary rod-shaped magnets 9 in such a way as to be in parallel to the auxiliary rod-shaped magnets 9 and spaced apart from the auxiliary rod-shaped magnets 9 with gaps therebetween. The return magnets 8 and 85 are disposed such that the electrons are drifted in such a direction as to suppress the escape of the electrons to the outside of the target 31.

In the magnet group 522, as indicted by arrows showing the electron drift directions in FIG. 9, the auxiliary rod-shaped magnets 9 generates a horizontal magnetic field as in the case of the main rod-shaped magnets 6, and the electrons are accelerated in a direction of E×B which is perpendicular to the longitudinal direction of the magnets. Therefore, at more areas, the electrons are accelerated around the core member 7, and thus the drift movement becomes more stable. As a result, the ionization occurs more intensely, and this leads to the increase of a discharge density and a deposition rate.

In this example as well as in the above examples, a uniform plasma may be generated over the entire projection area of the wafer 10 immediately below the target 31, and a high in-plane uniformity of the erosion is obtained. Therefore, the deposition rate can be increased while ensuring the in-plane uniformity of the high deposition rate, thereby improving the utilization efficiency of the target 31.

It was proven that the deposition rate ranging about 300 nm/min to 600 nm/min was obtained and a good in-plane uniformity of the deposition rate ranging from about 1% to 3% was obtained when a W film was formed on the wafer W having a size of about 300 mm under the conditions in which a DC power ranging from about 100 W to 3000 W was applied to the power supply unit 33; a pressure in the vacuum chamber 2 was set in a range from about 0.665 Pa to 13.3 Pa (about 5 mTorr to 100 mTorr); a distance between the target 31 and the wafer 10 was set in a range from about 10 mm to 100 mm; and a high frequency power ranging from about 10 W to 1000 W was supplied from the high frequency power supply unit 41.

Figure 11:
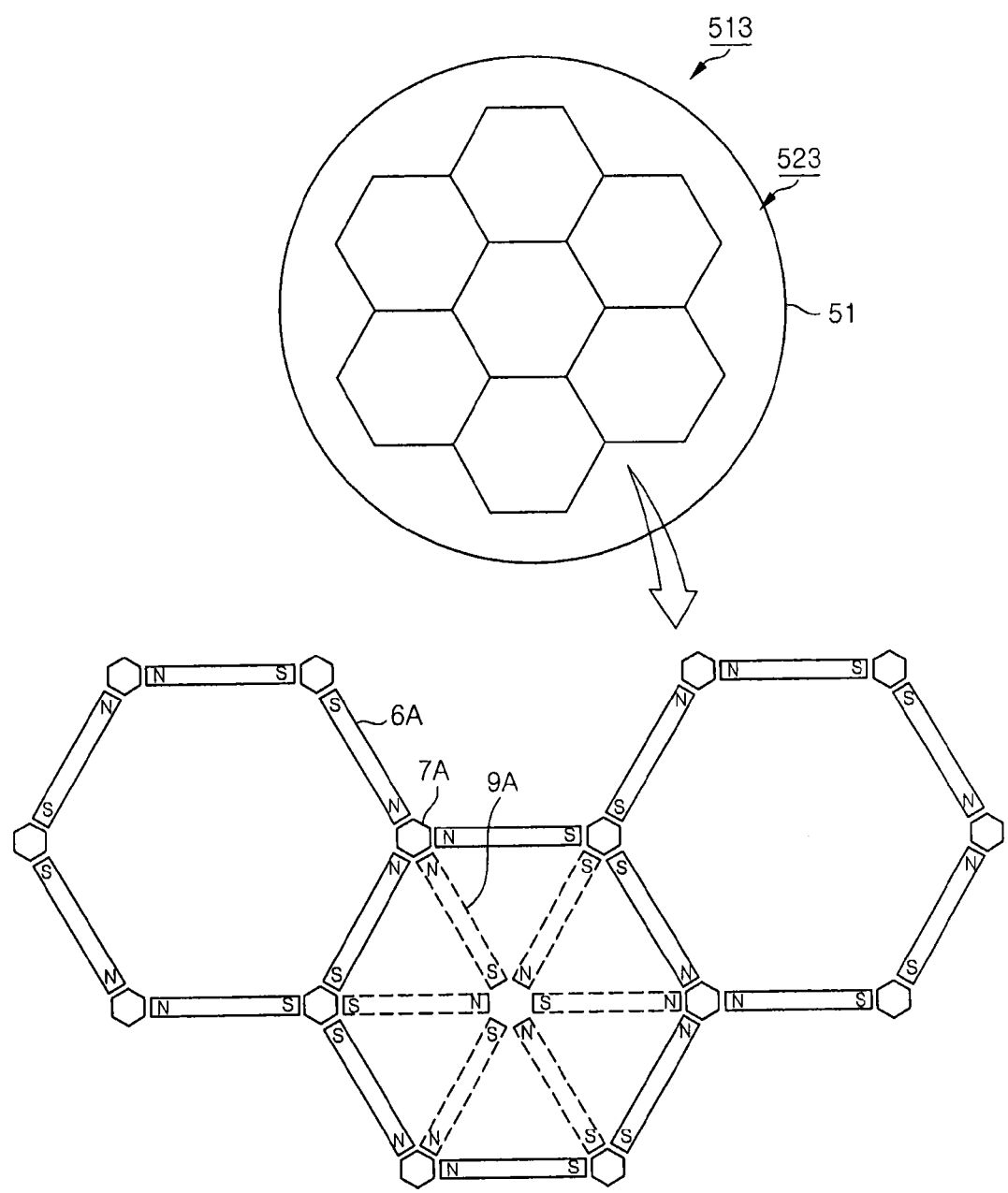
FIG. 11 is a plan view showing a third modified example of the magnet array body.

As described above, the magnet array body in accordance with the embodiment of the present invention may be configured in such a way that the rod-shaped magnets having different polarities at opposite ends thereof are arranged in a mesh shape along the surface of the base body facing the target; the mesh has an 2n polygonal shape (n being an integer greater than or equal to about 2); the permeable core members are disposed at the intersections of the mesh which are surrounded by the end surfaces of the rod-shaped magnets; and the end portions of the rod-shaped magnets which surround the core members have the same polarity. Therefore, in a magnet group 523 of a magnet array body 513 as the third modified example, the rod-shaped magnets may be arranged in a hexagon shape as shown in FIG. 11 schematically illustrating the mesh of the rod-shaped magnets. At this time, as indicated by dotted lines in FIG. 11, the main rod-shaped magnets 6A may be disposed in a 2n polygonal shape (hexagonal shape), and the auxiliary rod-shaped magnets 9A may be disposed inside the main rod-shaped magnets 6A. In this example, the core member 7A has a hexagonal shape in a plan view.

Here, the shape of the rod-shaped magnets seen from the above may be an ellipse without being limited to a rectangle. The shape of the core members 7 in a plan view is selected conforming to the arrangement shape of the rod-shaped magnets 6. For example, the core members 7 may have a circular shape or a polygonal shape such as a hexagon, an octagon or the like.

In accordance with the embodiment of the present invention, the return magnets may not be provided. However, when the return magnets are provided, it is preferable to arrange the return magnets in a line shape in order to return electrons inward without allowing the electrons to escape to the outside of the magnet group from the gaps of the magnet group. In this case, the shape of the line may be straight or curved. A single magnet may be formed in a line shape as described above, or a plurality of magnets may be in contact with each other. When a plurality of magnets have a function of returning electrons inward while preventing escape thereof to the outside, the magnets may be disposed with slight gaps therebetween.

Further, it is not necessary to rotate the magnet array body 5. However, when the magnet array body 5 is rotated, it may be rotated by the rotation device 56 about a vertical axis having the center O of the base body 51 as the rotation center. When the magnet array body 5 is rotated, a plasma is generated over the entire projection area of the wafer 10 by the magnet group 52. Therefore, when the magnet array body 5 is eccentrically rotated, a plasma is generated over the entire projection area of the wafer 10 even though a part of the peripheral portion of the wafer 10 is located at an outer side of the magnet group 52 during the rotation.

When the magnet group is rotated eccentrically to the center O of the base body 51, the uniformity of the deposition rate can be improved by setting the inner magnet group 53 and the return magnets 8 to be spaced from each other at a region positioned outer than the peripheral portion of the wafer 10 by about 50 mm. In the same manner, if the sizes of the target 31 and the magnet array body 5 are set in such a way that the outer periphery of the target 31 is positioned at the space between the peripheral portion of the inner magnet group 53 and the return magnets 8 during the eccentric rotation, erosion can occur on the entire surface of target 31, thereby performing a uniform film forming process.

In the present embodiment, the mounting table 4 need not be necessarily used as an electrode, and thus a high frequency power need not necessarily be supplied to the mounting table 4. The rod-shaped magnets 6 are preferably arranged in such a way that a plasma is generated based on the drift of the electrons. However, the arrangement of the magnets is not limited to the above example. For example, on the surface of the base body 51, the arrangement gap or the arrangement shape of the magnets 6 may be varied.

The target 31 may be made of a conductor such as Cu, Al, Ti, TiN, Ta, TaNx, Ru, Hf, Mo or the like, or a dielectric material such as silicon oxide, silicon nitride or the like, other than tungsten. In that case, if the target is made of an insulator, a plasma is generated by supplying a high frequency voltage from the power supply unit. A plasma may also be generated by applying a high frequency voltage to a target made of a conductor.

Figure 12:
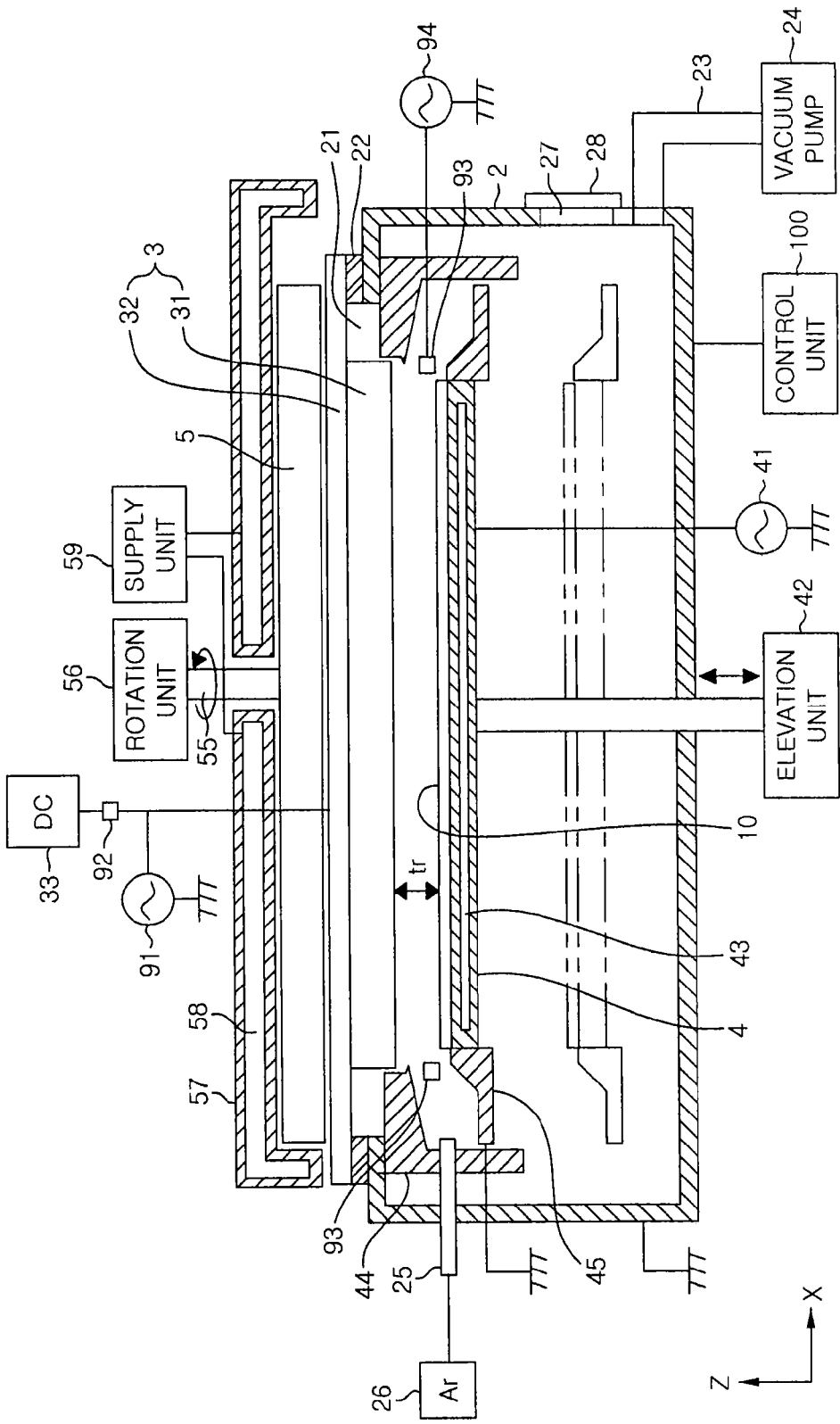
FIG. 12 is a vertical cross sectional view of another example of the magnetron sputtering apparatus.

In the magnetron sputtering apparatus in accordance with the embodiment of the present invention, as described in FIG. 12, a high frequency power supply unit 91 for a target electrode may be connected to the target electrode 3, to thereby apply a high frequency voltage ranging from several hundreds of kHz to 100 MHz to the target electrode 3. A reference numeral 92 in FIG. 12 indicates a filter circuit for suppressing the intrusion of a high frequency voltage from the high frequency power supply unit 91 to a circuit of the power supply unit 33. Further, a plurality of auxiliary electrodes 93 spaced apart from each other with gaps therebetween along the circumferential direction of the wafer 10 may be disposed between the target 31 and the wafer 10 located at a sputtering position in such a way as to surround the wafer 10, and a high frequency voltage may be applied from a high frequency power supply unit 94 for an auxiliary electrode to the auxiliary electrodes 93.

A current density of the target electrode 3 and a deposition rate are increased when the sputtering is performed while applying to the target electrode 3 a high frequency voltage from the high frequency power supply unit 91 and a DC voltage from the power supply unit 33. In addition, the current density of the target electrode 3 and the film forming speed are increased when the sputtering is performed while applying a voltage from one of the power supply unit 33 and the high frequency power supply unit 91 for a target electrode to the target electrode 3 and applying a high frequency voltage from the high frequency power supply unit 94 to the auxiliary electrode 93. Even in the configuration shown in FIG. 12, the sputtering may be carried out while applying a bias voltage to the mounting table 4.

The magnetron sputtering apparatus of the present embodiment may also be applied to the sputtering of a target substrate to be processes such as plastic, glass for liquid crystal or solar cell other than a semiconductor wafer.

While the invention has been shown and described with respect to the embodiments, it will be understood by those skilled in the art that various changes and modifications may be made without departing from the scope of the invention as defined in the following claims.

What is claimed is:

1. A magnetron sputtering apparatus in which a target is disposed to face a substrate to be processed installed in a vacuum chamber, the apparatus comprising:
   a power supply unit configured to apply a voltage to the target; and
   a magnet array body provided at a rear side of the target and comprising a base body and a magnet group arranged on the base body,
   wherein:
   the magnet group comprises rod-shaped magnets each having different polarities at opposite ends thereof, and permeable core members;
   the rod-shaped magnets are disposed in a mesh shape on a surface of the base body facing the target;
   the permeable core members are disposed at intersection points of the mesh shape, such that the permeable core members are surrounded by the ends of the rod-shaped magnets;
   the mesh shape is a polygon with 2n sides, n being an integer equal to or greater than 2;
   end portions of the rod-shaped magnets which surround each of the core members have a same polarity; and
   the core members lie on a same plane as the rod-shaped magnets.

2. The magnetron sputtering apparatus of claim 1, wherein, in the magnet array body, N poles and S poles of the magnet group are arranged such that a plasma is generated over an entire projection area of the substrate.

3. The magnetron sputtering apparatus of claim 1, wherein the magnet group comprises return magnets arranged at the outermost periphery thereof in a line shape to prevent electrons from being released from binding of a cusp magnetic field and escaping to the outside of the cusp magnetic field.

4. The magnetron sputtering apparatus of claim 1, further comprising a rotation unit for rotating the magnet array body about an axis perpendicular to the substrate.

5. The magnetron sputtering apparatus of claim 1, further comprising:
   an electrode disposed at an opposite side of the substrate relative to the target; and
   a high frequency power supply unit configured to supply high frequency power to the electrode.

6. The magnetron sputtering apparatus of claim 1, wherein a distance between the target and the substrate during sputtering is in a range from about 10 mm to 50 mm.

7. The magnetron sputtering apparatus of claim 1, wherein the end portions of the rod-shaped magnets surrounding each of the core members are spaced from corresponding end portions of each of the core members by a same distance.

8. The magnetron sputtering apparatus of claim 1, wherein the mesh has a square shape.

9. The magnetron sputtering apparatus of claim 1, wherein the permeable core members are spaced apart from the rod-shaped magnets.

10. A magnetron sputtering apparatus in which a target is disposed to face a substrate to be processed installed in a vacuum chamber, the apparatus comprising:
    a power supply unit configured to apply a voltage to the target; and
    a magnet array body provided at a rear side of the target and comprising a base body and a magnet group arranged on the base body,
    wherein:

the magnet group comprises rod-shaped magnets each having different polarities at opposite ends thereof, and permeable core members;

the rod-shaped magnets are disposed in a mesh shape on a surface of the base body facing the target;

the permeable core members are disposed at intersection points of the mesh, such that the permeable core members are surrounded by the ends of the rod-shaped magnets;

the mesh shape is a polygon with 2n sides, n being an integer equal to or greater than 2;

end portions of the rod-shaped magnets which surround each of the core members have a same polarity; and the core members are spaced apart from the rod-shaped magnets.

11. The magnetron sputtering apparatus of claim 10, wherein, in the magnet array body, N poles and S poles of the magnet group are arranged such that a plasma is generated over an entire projection area of the substrate.

12. The magnetron sputtering apparatus of claim 10, wherein the magnet group comprises return magnets arranged at the outermost periphery thereof in a line shape to prevent electrons from being released from binding of a cusp magnetic field and escaping to the outside of the cusp magnetic field.

13. The magnetron sputtering apparatus of claim 10, further comprising a rotation unit for rotating the magnet array body about an axis perpendicular to the substrate.

14. The magnetron sputtering apparatus of claim 10, further comprising:

an electrode disposed at an opposite side of the substrate relative to the target; and a high frequency power supply unit configured to supply high frequency power to the electrode.

15. The magnetron sputtering apparatus of claim 10, wherein a distance between the target and the substrate during sputtering is in a range from about 10 mm to 50 mm.

16. The magnetron sputtering apparatus of claim 10, wherein the end portions of the rod-shaped magnets surrounding each of the core members are spaced from corresponding end portions of each of the core members by a same distance.

17. The magnetron sputtering apparatus of claim 10, wherein the mesh has a square shape.

* * * * *